United States Patent
Hatakeyama et al.

(10) Patent No.: US 6,436,606 B1
(45) Date of Patent: Aug. 20, 2002

(54) POLYMERS, RESIST COMPOSITIONS AND PATTERNING PROCESS

(75) Inventors: Jun Hatakeyama; Jun Watanabe; Yuji Harada, all of Nakakubiki-gun (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 28 days.

(21) Appl. No.: 09/650,408

(22) Filed: Aug. 29, 2000

(30) Foreign Application Priority Data

Aug. 30, 1999 (JP) .......................................... 11-243101

(51) Int. Cl.$^7$ ......................... C08F 222/02; C08F 16/24
(52) U.S. Cl. ............................... 430/270.1; 430/286.1; 526/247; 526/249
(58) Field of Search .................. 526/242, 247, 526/249; 430/270.1, 281.1, 286.1

(56) References Cited

U.S. PATENT DOCUMENTS

| | | | | |
|---|---|---|---|---|
| 2,468,664 A | * | 4/1949 | Hanford et al. ................ 260/86 |
| 2,925,424 A | * | 2/1960 | Simmons et al. .......... 260/340.7 |
| 3,314,850 A | * | 4/1967 | Gilbert et al. ................. 167/52 |
| 3,749,791 A | * | 7/1973 | Terrell et al. ................ 424/278 |
| 3,865,845 A | * | 2/1975 | Resnick ................... 260/340.9 |
| 3,978,030 A | * | 8/1976 | Resnick ....................... 526/247 |
| 4,431,786 A | * | 2/1984 | Squire ......................... 526/247 |
| 4,491,628 A | | 1/1985 | Ito et al. |
| 4,558,141 A | * | 12/1985 | Squire ......................... 549/455 |
| 4,908,410 A | * | 3/1990 | Malhotra .................... 525/276 |
| 5,286,825 A | * | 2/1994 | Anton et al. ................. 526/247 |
| 5,498,682 A | * | 3/1996 | Navarrini et al. ........... 526/247 |
| 5,843,624 A | | 12/1998 | Houlihan et al. |
| 5,883,177 A | * | 3/1999 | Colaianna et al. .......... 524/462 |
| 5,968,713 A | | 10/1999 | Nozaki et al. |
| 5,998,099 A | | 12/1999 | Houlihan et al. |
| 6,013,416 A | | 1/2000 | Nozaki et al. |
| 6,066,707 A | * | 5/2000 | Colaianna et al. .......... 526/247 |
| 6,107,423 A | * | 8/2000 | Wheland et al. ............ 526/249 |
| 6,201,084 B1 | * | 3/2001 | Abusleme et al. .......... 526/247 |
| 6,228,963 B1 | * | 5/2001 | Wheland et al. ............ 526/247 |
| 6,277,936 B1 | * | 8/2001 | Abusleme et al. .......... 256/247 |
| 2001/0012880 A1 | * | 8/2001 | Wheland et al. ............ 526/249 |

FOREIGN PATENT DOCUMENTS

| | | |
|---|---|---|
| JP | 63-27829 | 2/1988 |
| JP | 2-27660 | 6/1990 |
| JP | 9-73173 | 8/1997 |
| JP | 9-230595 | 9/1997 |
| JP | 10-10739 | 1/1998 |
| WO | 97/33198 | 9/1997 |

OTHER PUBLICATIONS

Davidson et al., "The photoinitiated polymerisation of 4–methylene–1,3–dioxolanes"; Journal of Photochemistry and Photobiology A: Chemistry 109 (1997) 185–193.*
English Abstract for JP 63–27829.

* cited by examiner

Primary Examiner—Janet Baxter
Assistant Examiner—Yvette M. Clarke
(74) Attorney, Agent, or Firm—Millen, White, Zelano & Branigan, P.C.

(57) ABSTRACT

Polymers comprising recurring units of formula (1) and recurring units having acid labile groups are novel.

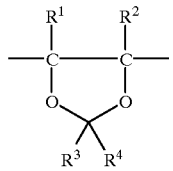

(1)

At least one of $R^1$ and $R^2$ is fluorine or a trifluoromethyl group, and the remainder is hydrogen or a $C_{1-20}$ alkyl, $R^3$ and $R^4$ each are hydrogen or an unsubstituted or fluorine-substituted $C_{1-20}$ alkyl, or $R^3$ and $R^4$ may form a ring. Using such polymers, resist compositions featuring transparency to excimer laser light and alkali solubility are obtained.

21 Claims, 1 Drawing Sheet

POLYMERS, RESIST COMPOSITIONS AND PATTERNING PROCESS

This invention relates to polymers useful as the base polymer in chemical amplification resist compositions suited for microfabrication. It also relates to chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated.

A wavelength change-over from KrF to shorter wavelength ArF laser (193 nm) is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198. With respect to $F_2$ excimer laser (157 nm) which is expected to enable further miniaturization to 0.10 μm or less, more difficulty arises in insuring transparency because it was found that acrylic resins are not transmissive to light at all and those cycloolefin resins having carbonyl bonds have strong absorption. As long as the inventor has confirmed, polyvinylphenol has a window for absorption in proximity to 160 nm, so the transmittance is somewhat improved, but far below the practical level, and reducing carbonyl and carbon-to-carbon double bonds is essential for insuring a transmittance.

SUMMARY OF THE INVENTION

An object of the invention is to provide a novel polymer having a high transmittance to vacuum ultraviolet radiation of up to 300 nm, especially of 157 nm, 146 nm, 134 nm and 126 nm, and useful as the base resin in a chemical amplification resist composition. Another object is to provide a chemical amplification resist composition comprising the polymer, and a patterning process using the same.

It has been found that a polymer comprising recurring units of the following general formula (1) is effective as the base polymer in chemical amplification resist compositions because the resulting resist composition has an improved transmittance to vacuum ultraviolet radiation.

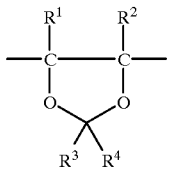
(1)

Herein at least one of $R^1$ and $R^2$ is fluorine or a trifluoromethyl group, and the remainder is hydrogen or a straight, branched or cyclic alkyl group of 1 to 20 carbon atoms, $R^3$ and $R^4$ each are hydrogen or a straight, branched or cyclic, unsubstituted or fluorine-substituted alkyl group of 1 to 20 carbon atoms, or $R^3$ and $R^4$, taken together, may form a ring.

In a first aspect, the invention provides a polymer comprising recurring units of formula (1) defined above and recurring units having acid labile groups.

The recurring units having acid labile groups are preferably of any one of the following formulae (2) to (8):

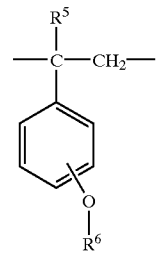
(2)

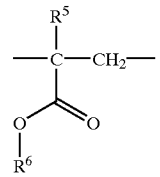
(3)

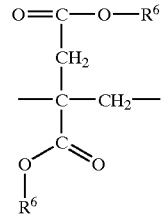
(4)

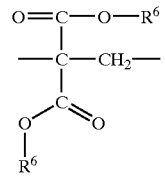
(5)

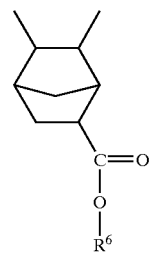
(6)

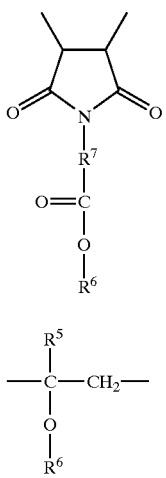

(7)

(8)

Herein $R^5$ is hydrogen or a straight, branched or cyclic alkyl group of 1 to 10 carbon atoms, $R^6$ is an acid labile group, and $R^7$ is an alkylene group of 1 to 10 carbon atoms.

In a second aspect, the invention provides a chemical amplification positive resist composition comprising (A) a polymer comprising recurring units of the formula (1) or a polymer comprising recurring units of the formula (1) and recurring units having acid labile groups, (B) an organic solvent, and (C) a photoacid generator. The resist composition may further include (D) a basic compound and/or (E) a dissolution inhibitor.

In a still further aspect, the invention provides a process for forming a pattern, comprising the steps of applying the resist composition onto a substrate to form a coating; heat treating the coating and exposing the coating to high energy radiation with a wavelength of up to 300 nm or electron beam through a photo-mask; optionally heat treating the exposed coating, and developing the coating with a developer.

As long as the inventor knows, polyvinyl alcohol has relatively low absorption because of the absence of carbonyl group, and halogen substitution, especially fluorine substitution on polyvinyl alcohol is effective for improving transmittance to a practically acceptable level. Since the development step of photolithography generally involves applying alkaline water to a resist film by puddling or dipping, rinsing with pure water and spin drying, it is necessary to adjust the solubility of a polymer in alkali relatively high and the solubility in pure water relatively low. Since polyvinyl alcohol is so water soluble that it is used as the base polymer in resists adapted to water development, polyvinyl alcohol has the problem that it is dissolved not only upon alkali development, but also upon rinsing. This necessitates to increase the solubility of a polymer in alkali, thereby enlarging the difference from its solubility in water.

The units represented by formula (1) according to the invention are characterized in that they are cleaved with an acid to create a fluoroalcohol and thus become soluble in alkali. More specifically, the polymer of the invention has units in which dialcohol is blocked with an acetal bond whereby its solubility in alkaline solution is improved over polyvinyl alcohol. By copolymerizing recurring units having acid labile groups, the polymer is improved in dissolution contrast, providing for a better positive resist material. Among the functions required for photoresists, the alkaline solubility is, of course, crucial to form a pattern, but satisfying only the alkaline solubility is insufficient. That is, dry etching resistance and adhesion to the substrate are also crucial functions. To improve the dry etching resistance, it is generally believed effective to increase the carbon density and to incorporate a cyclic structure as typified by a bridged cyclic hydrocarbon group. The polymer of the invention is effective in this respect too.

DESCRIPTION OF THE PREFERRED EMBODIMENT

Polymer

Figure 1:
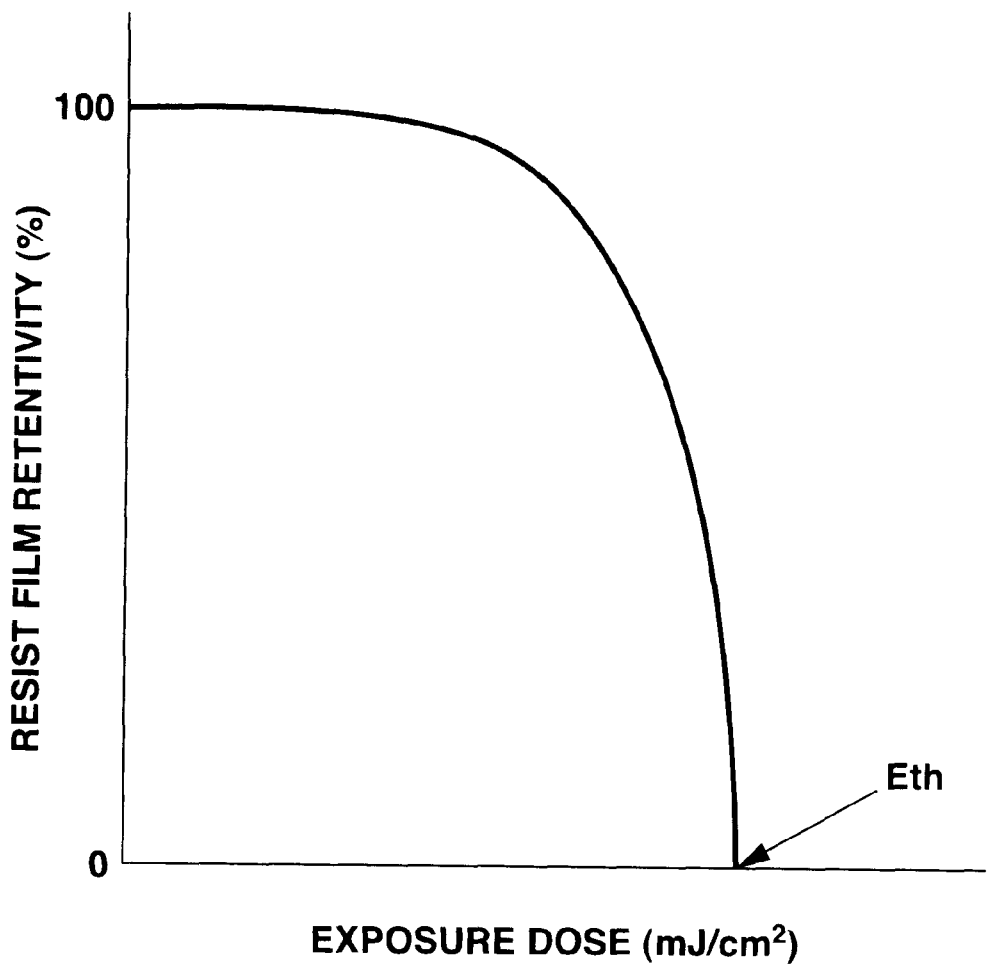
FIG. 1 is a graph showing the relationship of resist film retentivity to exposure dose.

According to the invention, the polymers are defined as comprising recurring units of the following general formula (1).

(1)

Herein at least one of $R^1$ and $R^2$ is a fluorine atom or a trifluoromethyl group. Both $R^1$ and $R^2$ may be fluorine atoms or trifluoromethyl groups. When either one of $R^1$ and $R^2$ is fluorine or a trifluoromethyl group, the remainder is hydrogen or a straight, branched or cyclic alkyl group of 1 to 20 carbon atoms. $R^3$ and $R^4$ each are hydrogen or a straight, branched or cyclic, unsubstituted or fluorine-substituted alkyl group of 1 to 20 carbon atoms, or $R^3$ and $R^4$, taken together, may form a ring.

The straight, branched or cyclic alkyl groups of 1 to 20 carbon atoms represented by $R^1$ to $R^4$ include methyl, ethyl, propyl, isopropyl, n-butyl, sec-butyl, tert-butyl, cyclopentyl, cyclohexyl, 2-ethylhexyl, and n-octyl. Alkyl groups of 1 to 12 carbon atoms are more preferable.

The fluorine-substituted alkyl groups correspond to the alkyl groups described just above in which some or all of the hydrogen atoms are replaced by fluorine atoms. Examples include trifluoromethyl, 3,3,3-trifluoropropyl and 2,2,2-trifluoroethyl. When $R^3$ and $R^4$ form a ring, they are preferably straight or branched alkylene groups, provided that the total number of carbon atoms is from 3 to 20, especially from 3 to 12.

In addition to the recurring units of formula (1), the polymer of the invention further contains recurring units having acid labile groups, preferably recurring units having acid labile groups of any one of the following formulae (2) to (8).

(2)
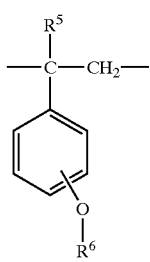

(3)
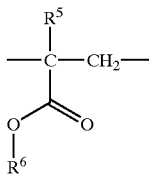

(4)
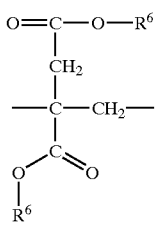

(5)
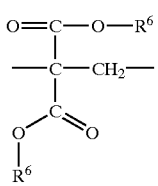

(6)
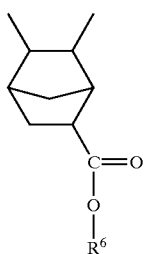

(7)
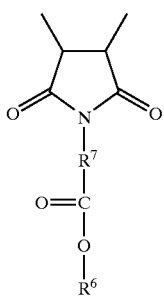

(8)
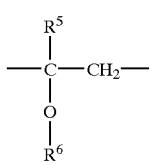

Herein $R^5$ is hydrogen or a straight, branched or cyclic alkyl group of 1 to 10 carbon atoms, $R^6$ is an acid labile group, and $R^7$ is an alkylene group of 1 to 10 carbon atoms.

Examples of the alkyl group represented by $R^5$ are the same as exemplified for $R^3$ and $R^4$, but having 1 to 10 carbon atoms. Examples of the alkylene group represented by $R^7$ are the same as these alkyl groups with one hydrogen atom being eliminated therefrom.

The acid labile group represented by $R^6$ is selected from a variety of such groups, preferably from among the groups of the following formulae (9) and (10), tertiary $C_{4-40}$ alkyl groups of the following formula (11), trialkylsilyl groups whose alkyl groups each have 1 to 6 carbon atoms, and oxoalkyl groups of 4 to 20 carbon atoms.

(9)
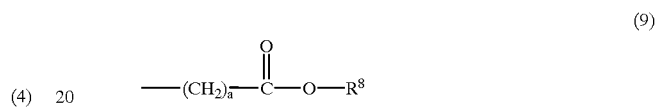

(10)

(11)

In formula (9), $R^8$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (10). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxoran-5-yl. Letter "a" is an integer of 0 to 6.

In formula (10), $R^9$ and $R^{10}$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{11}$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

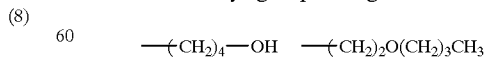
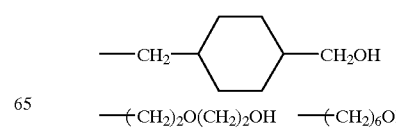

-continued

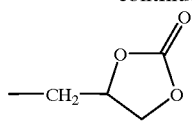

A pair of $R^9$ and $R^{10}$, a pair of $R^9$ and $R^{11}$, or a pair of $R^{10}$ and $R^{11}$, taken together, may form a ring. Each of $R^9$, $R^{10}$ and $R^{11}$ is a straight or branched alkylene group of 1 to 18 carbon atoms, preferably 1 to 10 carbon atoms, when they form a ring.

Illustrative examples of the acid labile groups of formula (9) include tert-butoxycarbonyl, tert-butoxycarbonylmethyl, tert-amyloxycarbonyl, tert-amyloxycarbonyl-methyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Of the acid labile groups of formula (10), illustrative examples of the straight or branched groups are given below.

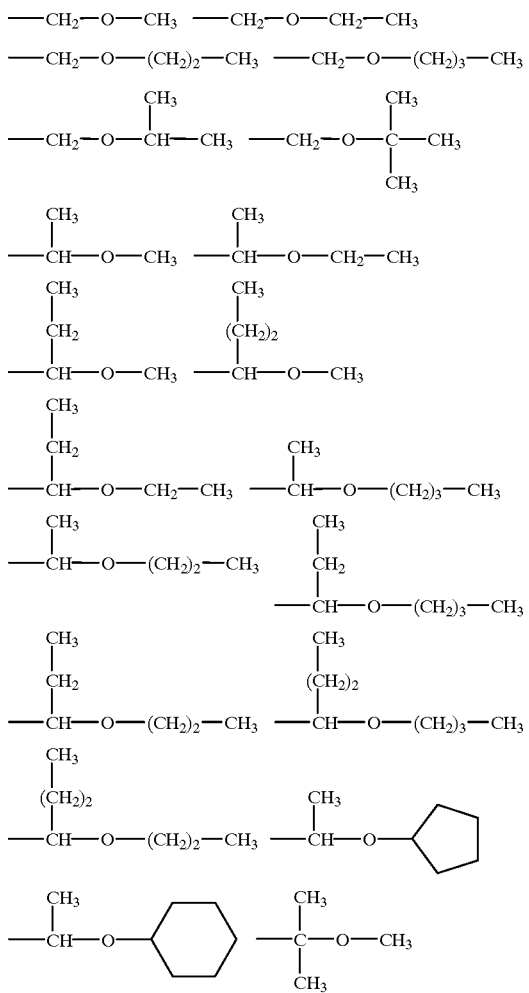

-continued

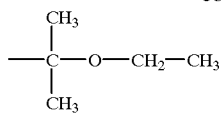

Of the acid labile groups of formula (10), illustrative examples of the cyclic groups include tetrahydrofuran-2-yl, 2-methyltetrahydrofuran-2-yl, tetrahydropyran-2-yl and 2-methyltetrahydropyran-2-yl. Preferred among the groups of formula (10) are ethoxyethyl, butoxyethyl and ethoxypropyl.

In formula (11), $R^{12}$, $R^{13}$ and $R^{14}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{12}$ and $R^{13}$, a pair of $R^{12}$ and $R^{14}$, or a pair of $R^{13}$ and $R^{14}$, taken together, may form a ring.

Examples of the tertiary alkyl group represented by formula (11) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (11-1) through (11-16).

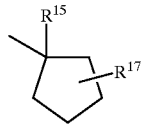

(11-1)

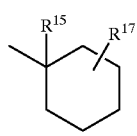

(11-2)

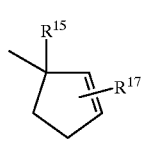

(11-3)

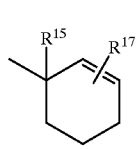

(11-4)

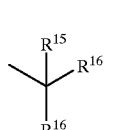

(11-5)

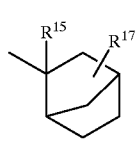

(11-6)

-continued (11-7) 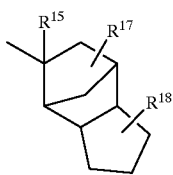

(11-8) 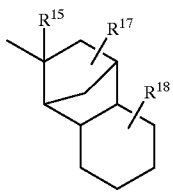

(11-9) 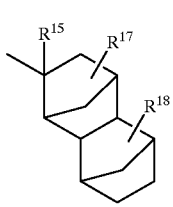

(11-10) 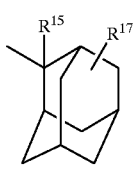

(11-11) 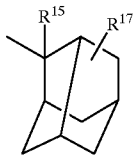

(11-12) 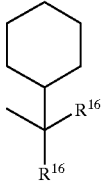

(11-13) 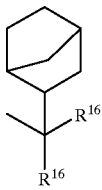

(11-14) 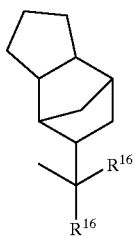

(11-15) 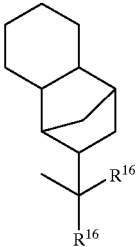

(11-16) 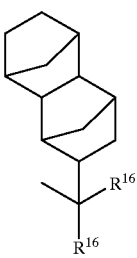

Herein, $R^{15}$ and $R^{16}$ are independently straight, branched or cyclic alkyl groups of 1 to 6 carbon atoms, for example, methyl, ethyl, propyl, isopropyl, n-butyl, sec-butyl, n-pentyl, n-hexyl, cyclopropyl and cyclopropylmethyl. $R^{17}$ is hydrogen or a monovalent hydrocarbon group of 1 to 6 carbon atoms which may contain a hetero atom or a monovalent hydrocarbon group of 1 to 6 carbon atoms, typically alkyl, which may be separated by a hetero atom. The hetero atom is an oxygen, sulfur or nitrogen atom, which is contained or intervenes in the form of —OH, —OR, —O—, —S—, —S(=O)—, —NH$_2$, —NHR, —NR$_2$, —NH, or —NR— wherein R is an alkyl group of 1 to 20 carbon atoms, and especially 1 to 16 carbon atoms.

$R^{18}$ is hydrogen or an alkyl, hydroxyalkyl, alkoxyalkyl, alkoxy or alkoxyalkyl group of 1 to 20 carbon atoms, especially 1 to 16 carbon atoms, which may be straight, branched or cyclic. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Of the acid labile group represented by $R^6$, the trialkylsilyl groups whose alkyl groups each have 1 to 6 carbon atoms include trimethylsilyl, triethylsilyl, and tert-butyldimethylsilyl.

The oxoalkyl groups of 4 to 20 carbon atoms include 3-oxocyclohexyl and groups of the following formulae.

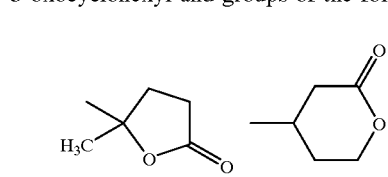

The polymers comprising units of formula (1) according to the invention preferably have a weight average molecular weight of about 1,000 to 1,000,000, and especially about 2,000 to 100,000. An appropriate proportion of the recurring units of formula (1) is 10 to 80 mol %, and especially 20 to 60 mol % of the polymer, the balance being essentially the recurring units having acid labile groups, and especially the recurring units of formulae (2) to (8).

In preparing the polymer of the invention, a monomer of the following general formula (1a) is copolymerized with at least one monomer of the following general formula (2a) to (8a).

(1a)
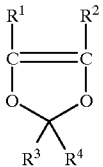

Herein R¹ to R⁴ are as defined above.

(2a) (3a) (4a) (5a) (6a) (7a)
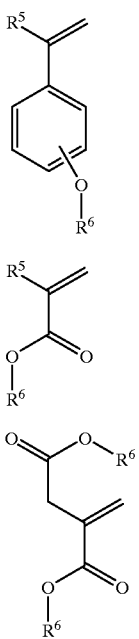

(8a)
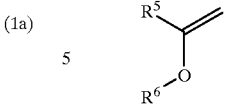

Herein $R^5$ to $R^7$ are as defined above.

In the preparation of the polymer, there may be copolymerized another co-monomer for the purpose of improving dry etching resistance or adhesion. Specifically, for the former purpose, a co-monomer having an alicyclic substituent is used. For the adhesion improvement, there may be used a co-monomer having an oxygen, nitrogen or sulfur atom-containing substituent such as a ketone, ester, lactone, acid anhydride, alcohol, carbonate, amide ester or thio ester. Such co-monomers may be used alone or in admixture of two or more.

In general, the above polymer is prepared by mixing the above monomer with a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for polymerization to form the polymer of the invention are radical copolymerization of triggering polymerization with radicals of α,α'-azobisisobutyronitrile (AIBN) or the like, and ion (anion) polymerization using catalysts such as alkyl lithium. Such polymerization may be effected in a conventional manner.

The polymers of the invention are useful as the base polymer in resist compositions, preferably chemical amplification type resist compositions, and especially chemical amplification type positive working resist compositions.

Resist Composition

A second embodiment of the invention is a chemical amplification positive resist composition comprising (A) a polymer comprising recurring units of the formula (1) or a polymer comprising recurring units of the formula (1) and recurring units having acid labile groups, (B) an organic solvent, and (C) a photoacid generator. The resist composition may further contain (D) a basic compound or (E) a dissolution inhibitor or both.

Component (B)

The organic solvent used as component (B) in the invention may be any organic solvent in which the photoacid generator, base resin, dissolution inhibitor, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

An appropriate amount of the organic solvent used is about 100 to 10,000 parts, especially about 200 to 2,000 parts by weight per 100 parts by weight of the base resin which is the polymer of the invention.

Component (C)

Suitable examples of the photoacid generator serving as component (C) include onium salts of general formula (12) below, diazomethane derivatives of formula (13), glyoxime derivatives of formula (14), β-ketosulfone derivatives, disulfone derivatives, nitrobenzylsulfonate derivatives, sulfonic acid ester derivatives, and imidoyl sulfonate derivatives.

(12)

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

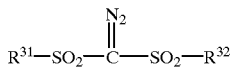

(13)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

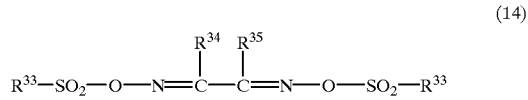

(14)

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluene-sulfonyl)-α-dimethylglyoxime, bis-o-(p-toluenesulfonyl)-α-diphenylglyoxime, bis-o-(p-toluenesulfonyl)-α- dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, and tris(p-tert-butoxyphenyl)sulfonium p-toluenesulfonate; diazomethane derivatives such as bis(benzenesulfonyl)diazomethane, bis (p-toluenesulfonyl)diazomethane, bis(cyclohexylsulfonyl) diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight, and especially about 0.5 to 8 parts by weight, per 100 parts by weight of all the base resins. At less than 0.2 part, the amount of acid generated during exposure would be too small and the sensitivity and resolution are poor, whereas the addition of more than 15 parts would lower the transmittance of the resist and results in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (15) and (16) may also be included.

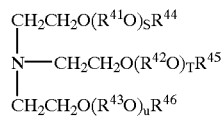

(15)

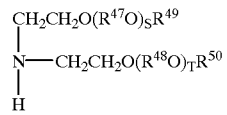

(16)

In the formulas, $R^{41}$, $R^{42}$ $R^{43}$ $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$ $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (15) and (16) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of all the base resins. At less than 0.01 part, the desired effects of the basic compound would not be apparent, while the use of more than 2 parts would result in too low a sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thimolphthalein. The acid labile substituents may be well-known ones.

Illustrative, non-limiting, examples of the dissolution inhibitors which are useful herein include bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl) valerate,
tert-butyl 4,4-bis(4'-(2"-tetrahydrofuranyloxy)phenyl) valerate,
tert-butyl 4,4-bis(4-tert-butoxyphenyl)valerate,
tert-butyl 4,4-bis(4-tert-butoxycarbonyloxyphenyl) valerate,
tert-butyl 4,4-bis(4'-tert-butoxycarbonylmethyloxyphenyl)valerate,
tert-butyl 4,4-bis(4'-(1"-ethoxyethoxy)phenyl)valerate,
tert-butyl 4,4-bis(4'-(1"-ethoxypropyloxy)phenyl) valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

In the resist composition according to the invention, an appropriate amount of the dissolution inhibitor (E) is up to about 20 parts, and especially up to about 15 parts by weight per 100 parts by weight of the solids in the composition. With more than 20 parts of the dissolution inhibitor, the resist composition becomes less heat resistant because of an increased content of monomer components.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 $\mu$m, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays having a wavelength below 300 nm, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to fine pattern formation with, in particular, deep-UV rays having a wavelength of 120 to 254 nm, an excimer laser, especially ArF excimer laser (193 nm), $F_2$ excimer laser (157 nm), $Kr_2$ excimer laser (146 nm) or $Ar_2$ excimer laser (129 nm), x-rays, or an electron beam. The desired pattern may not be obtainable outside the upper and lower limits of the above range.

Because the inventive resist composition enables its use particularly as a resist having a low absorption at the exposure wavelength of $F_2$ excimer laser and a solubility in alkaline solution, a finely defined pattern having sidewalls perpendicular to the substrate can easily be formed, making the resist ideal as a micropatterning material in VLSI fabrication. The polymer of the invention is best suited as the base polymer in such resist compositions.

EXAMPLE

Examples of the invention are given below by way of illustration and not by way of limitation. AIBN denotes α,α'-azobisisobutyronitrile.

Synthesis Example 1

Synthesis of Poly(4,5-difluoro-2,2-ditrifluoromethyl-1,3-oxol)/t-butoxyvinyl Copolymer In a 1-liter autoclave, 20 g of 4,5-difluoro-2,2-ditrifluoromethyl-1,3-oxol and 50 g of t-butoxyvinyl were dissolved in 300 ml of toluene. After oxygen was fully purged out of the system, 2.4 g of initiator AIBN was admitted. The autoclave was heated at 60° C., at which polymerization reaction was effected for 24 hours.

In order to work up the polymer, the reaction mixture was poured into a 4/1 mixture of hexane and ether whereupon the polymer precipitated. The polymer was dissolved in acetone and poured into 5 liters of pure water for precipitation, and this procedure was repeated twice. It was separated and dried, obtaining 45 g of a white polymer, poly(4,5-difluoro-2,2-ditrifluoromethyl-1,3-oxol)/t-butoxyvinyl copolymer. This polymer was found to have a weight average molecular weight (Mw) of 9,800 g/mol as measured by the light scattering method, a dispersity (Mw/Mn) of 2.10 as determined from the GPC elution curve, and a copolymer ratio of 0.4:0.6 as determined from the NMR measurement.

Synthesis Example 2

Synthesis of Poly(4-trifluoromethyl-2,2-dimethyl-1,3-oxol)

In a 1-liter autoclave, 50 g of 4-trifluoromethyl-2,2-dimethyl-1,3-oxol was dissolved in 300 ml of toluene. After oxygen was fully purged out of the system, 1.7 g of initiator AIBN was admitted. The autoclave was heated at 60° C., at which polymerization reaction was effected for 24 hours.

In order to work up the polymer, the reaction mixture was poured into a 4/1 mixture of hexane and ether whereupon the polymer precipitated. The polymer was dissolved in acetone and poured into 5 liters of pure water for precipitation, and this procedure was repeated twice. It was separated and dried, obtaining 39 g of a white polymer, poly(4-trifluoromethyl-2,2-dimethyl-1,3-oxol). This polymer was found to have a weight average molecular weight (Mw) of 9,100 g/mol as measured by the light scattering method and a dispersity (Mw/Mn) of 1.50 as determined from the GPC elution curve.

Synthesis Example 3

Synthesis of Poly(4,5-difluoro-2,2-ditrifluoromethyl-1,3-oxol)/t-butyl bicyclo[2.2.1]hept-5-ene-2-carboxylate Copolymer In a 1-liter autoclave, 20 g of 4,5-difluoro-2,2-ditrifluoromethyl-1,3-oxol and 50 g of t-butyl bicyclo[2.2.1]hept-5-ene-2-carboxylate were dissolved in 300 ml of toluene. After oxygen was fully purged out of the system, 2.4 g of initiator AIBN was admitted. The autoclave was heated at 60° C., at which polymerization reaction was effected for 24 hours.

In order to work up the polymer, the reaction mixture was poured into a 4/1 mixture of hexane and ether whereupon the polymer precipitated. The polymer was dissolved in acetone and poured into 5 liters of pure water for precipitation, and this procedure was repeated twice. It was separated and dried, obtaining 35 g of a white polymer, poly(4,5-difluoro-2,2-ditrifluoromethyl-1,3-oxol)/t-butyl bicyclo[2.2.1]hept-5-ene-2-carboxylate copolymer. This polymer was found to have a weight average molecular weight (Mw) of 3,200 g/mol as measured by the light scattering method, a dispersity (Mw/Mn) of 1.86 as determined from the GPC elution curve, and a copolymer ratio of 0.4:0.6 as determined from the NMR measurement.

Synthesis Example 4

Synthesis of Poly(4,5-difluoro-2,2-ditrifluoromethyl-1,3-oxol)/t-butoxyvinyl/vinyl Pyrrolidone Copolymer In a 1-liter autoclave, 20 g of 4,5-difluoro-2,2-ditrifluoromethyl-1,3-oxol, 40 g of t-butoxyvinyl and 10 g of vinyl pyrrolidone were dissolved in 300 ml of toluene. After oxygen was fully purged out of the system, 2.4 g of initiator AIBN was admitted. The autoclave was heated at 60° C., at which polymerization reaction was effected for 24 hours.

In order to work up the polymer, the reaction mixture was poured into a 4/1 mixture of hexane and ether whereupon the polymer precipitated. The polymer was dissolved in acetone and poured into 5 liters of pure water for precipitation, and this procedure was repeated twice. It was separated and dried, obtaining 45 g of a white polymer, poly(4,5-difluoro-2,2-ditrifluoromethyl-1,3-oxol)/t-butoxyvinyl/vinyl pyrrolidone copolymer. This polymer was found to have a weight average molecular weight (Mw) of 13,000 g/mol as measured by the light scattering method, a dispersity (Mw/Mn) of 1.92 as determined from the GPC elution curve, and a copolymer ratio of 0.4:0.5:0.1 as determined from the NMR measurement.

Next, each of the polymers of Synthesis Examples (SE) 1 to 4, 1 g, was thoroughly dissolved in 10 g of propylene glycol monomethyl ether acetate, and passed through a 0.2-$\mu$m filter, obtaining a polymer solution.

The polymer solution was spin coated onto a $MgF_2$ substrate and baked on a hot plate at 100° C. for 90 seconds, forming a polymer layer of 300 nm thick on the $MgF_2$ substrate. Using a vacuum ultraviolet spectrometer (VUV200S by Nihon Bunko K.K.), the polymer layer was measured for transmittance at 248 nm, 193 nm and 157 nm. The results are shown in Table 1.

TABLE 1

| Polymer | Transmittance (%) at 248 nm | Transmittance (%) at 193 nm | Transmittance (%) at 157 nm |
| --- | --- | --- | --- |
| Polymer of SE1 | 88 | 78 | 60 |
| Polymer of SE2 | 88 | 70 | 56 |
| Polymer of SE3 | 88 | 82 | 45 |
| Polymer of SE4 | 88 | 75 | 48 |

EXAMPLES

Resist solutions were prepared in a conventional manner by formulating the polymer, photoacid generator, basic compound, dissolution inhibitor and solvent in the amounts shown in Table 2.

On silicon wafers, DUV-30 (Nissan Chemical K.K.) was coated to form films of 55 nm thick so that the reflectance to KrF light (248 nm) was reduced below 1%. On the coated substrates, the resist solutions were spin coated, then baked at 100° C. for 90 seconds on a hot plate to give resist films having a thickness of 300 nm.

Using an excimer laser stepper (NSR-2005EX8A, from Nikon Corporation; NA 0.5, θ 0.7, ordinary illumination), the resist films were exposed stepwise while changing the dose every exposure area of 4 mm by 4 mm. Immediately after exposure, the resist films were baked at 110° C. for 90 seconds and then developed for 60 seconds with a 2.38% aqueous solution of tetramethylammonium hydroxide. The relationship of resist film retentivity to exposure dose as shown in FIG. 1 was determined. The dose at which the resist film thickness was zero is designated Eth which is the sensitivity of the resist. The results are shown in Table 2.

The photoacid generators PAG1 and PAG2, dissolution inhibitor DRI, and basic compound TMMEA used are shown below.

PAG1

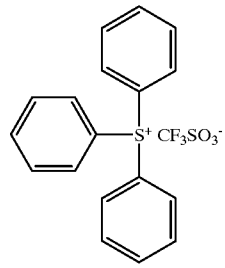

PAG2

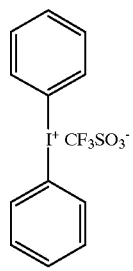

DRI

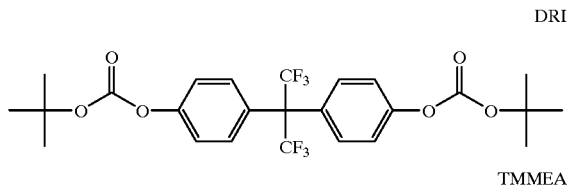

TMMEA

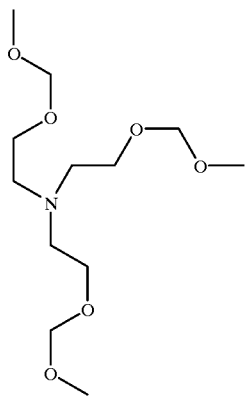

TBA: tributylamine
TEA: triethanolamine
TMMEA: trismethoxymethoxyethylamine (as above)
PGMEA: propylene glycol methyl ether acetate

TABLE 2

| Polymer (pbw) | Photoacid generator (pbw) | Basic compound (pbw) | Dissolution inhibitor (pbw) | Solvent (pbw) | Eth sensitivity (mJ/cm$^2$) |
|---|---|---|---|---|---|
| SE1 (100) | PAG1 (2) | TBA (0.1) | — | PGMEA (1000) | 30 |
| SE2 (100) | PAG1 (2) | TBA (0.1) | — | PGMEA (1000) | 20 |
| SE3 (100) | PAG1 (2) | TBA (0.1) | — | PGMEA (1000) | 35 |
| SE4 (100) | PAG1 (2) | TBA (0.1) | — | PGMEA (1000) | 25 |
| SE1 (100) | PAG2 (2) | TBA (0.1) | DRI (10) | PGMEA (1000) | 22 |
| SE1 (100) | PAG2 (2) | TBA (0.1) | — | PGMEA (1000) | 22 |
| SE1 (100) | PAG1 (2) | TEA (0.1) | — | PGMEA (1000) | 25 |
| SE1 (100) | PAG1 (2) | TMMEA (0.2) | — | PGMEA (1000) | 25 |

As is evident from Table 1, the films of the polymers are fully transparent at the wavelength (157 nm) of $F_2$ excimer laser. As is evident from Table 2, upon exposure to KrF excimer laser, the thickness of resist film decreases with an increasing exposure dose, indicating positive resist characteristics.

Japanese Patent Application No. 11-243101 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of the following general formula (1):

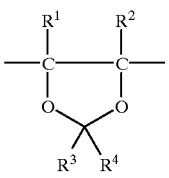

(1)

wherein at least one of $R^1$ and $R^2$ is fluorine or a trifluoromethyl group, and the remainder is hydrogen or a straight, branched or cyclic alkyl group of 1 to 20 carbon atoms, $R^3$ and $R^4$ each are hydrogen or a straight, branched or cyclic, unsubstituted or fluorine-substituted alkyl group of 1 to 20 carbon atoms, or $R^3$ and $R^4$, taken together, may form a ring, and recurring units having acid labile groups.

2. The polymer of claim 1 wherein the recurring units having acid labile groups are recurring units of any one of the following formulae (2) to (8):

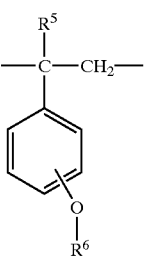

(2)

(3)

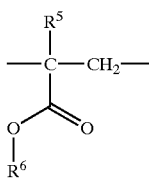

(4)

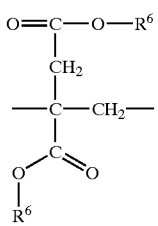

(5)

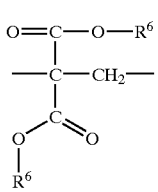

(6)

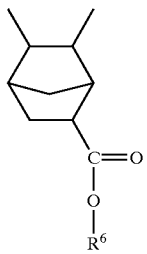

(7)

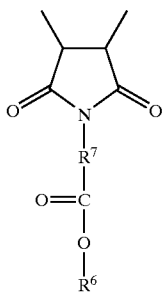

(8)

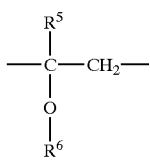

wherein $R^5$ is hydrogen or a straight, branched or cyclic alkyl group of 1 to 10 carbon atoms, $R^6$ is an acid labile group, and $R^7$ is an alkylene group of 1 to 10 carbon atoms.

3. A polymer of claim 1, wherein the straight, branched or cyclic alkyl group of 1 or 20 carbon atoms is methyl, ethyl, propyl, isopropyl, n-butyl, sec-butyl, tert-butyl, cyclopentyl, cyclohexyl, 2-ethylhexyl or n-octyl and the straight branched or cyclic unsubstituted alkyl group of 1 to 20 carbon atoms is trifluoromethyl, 3,3,3-trifluoropropyl or 2,2,2-trifluoroethyl.

4. A polymer of claim 1, wherein the straight, branched or cyclic alkyl group and the straight, branched or cyclic unsubstituted or fluorine-substituted alkyl group comprises 1 to 12 carbon atoms, and $R^3$ and $R^4$, together, forming a ring, comprise a straight or branched alkylene group each, the ring having 3 to 20 carbon atoms.

5. A polymer of claim 1, wherein the acid labile group is selected from the group consisting of groups of formulae (9), (10), (11), a trialkylsilyl group whose alkyl groups each have 1 to 6 carbon atoms, and an oxoalkyl group of 4 to 20 carbon atoms, (9)

(10)

(11)

wherein $R^8$ is a tertiary alkyl group of 4 to 20 carbon atoms, a trialkylsilyl group whose alkyl groups each have 1 to 6 carbon atoms, an oxoalkyl group of 4 to 20 carbon atoms or a group of formula (10), $R^9$ and $R^{10}$ are each independently hydrogen or straight, branched or cyclic alkyl groups of 1 to 18 carbon atoms, $R^{11}$ is a monovalent hydrocarbon group of 1 to 18 carbon atoms, which optionally comprises a hetero atom and in which optionally one or more hydrogen atoms are replaced by hydroxyl, alkoxy, oxo, amino or alkylamino groups, a pair of $R^9$ and $R^{10}$, a pair of $R^9$ and $R^{11}$, or a pair of $R^{10}$ and $R^{11}$, taken together, optionally forms a ring, wherein each of $R^9$, $R^{10}$, and $R^{11}$ is a straight or branched alkylene group of 1 to 18 carbon atoms when they form a ring, $R^{12}$, $R^{13}$ and $R^{14}$ are each independently a monovalent hydrocarbon group comprising a straight, branched or cyclic alkyl group of 1 to 20 carbon atoms, which optionally comprises a hetero atom in which a pair of $R^{12}$ and $R^{13}$, a pair of $R^{12}$ and $R^{14}$, or a pair of $R^{13}$ and $R^{14}$, taken together, optionally forms a ring.

6. A polymer of claim 1, wherein the acid labile group is selected from the group consisting of tert-butoxycarbonyl, tert-butoxy-carbonylmethyl, tert-amyloxycarbonyl, tert-amyloxycarbonyl-methyl, 1,1-diethylpropyloxycarbonyl, 1,1-diethylpropyloxycarbonylmethyl, 1-ethylcyclopentyl-oxycarbonyl, 1-ethylcyclopentyloxycarbonylmethyl, 1-ethyl-2-cyclopentenyloxycarbonyl, 1-ethyl-2-cyclopentenyl-oxycarbonylmethyl, 1-ethoxyethoxycarbonylmethyl, 2-tetrahydropyranyloxycarbonylmethyl, 2-tetrahydrofuranyloxycarbonylmethyl, (2)

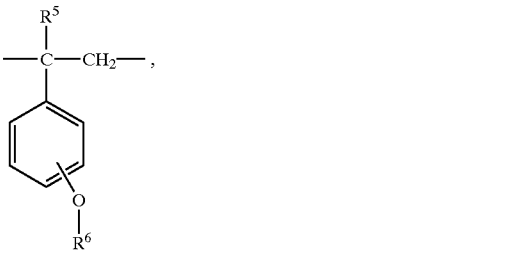

(3)
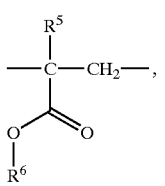

(4)
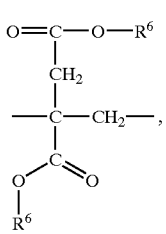

(5)
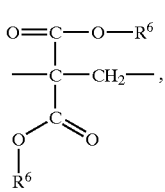

(6)
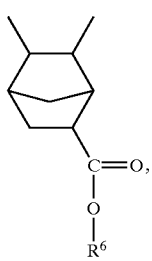

(7)
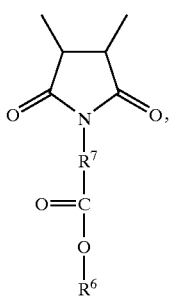

(8)
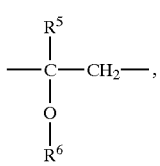

tetrahydrofuran-2-yl, 2-methyltetrahydrofuran-2-yl, tetrahydropyran-2-yl, 2-methyltetrahydropyran-2-yl, tert-butyl, triethylcarbyl, 1-ethylnorbornyl, 1-methylcyclohexyl, 1-ethylcyclopentyl, 2-(2-methyl)adamantyl, 2-(2-ethyl) adamantyl, tert-amyl, trimethylsilyl, triethylsilyl, tert-butyldimethylsilyl, and 3-oxocyclohexyl.

7. A polymer of claim 1, wherein the acid labile group is selected from the group consisting of groups of formulae (11-1) to (11-16)

(11-1)
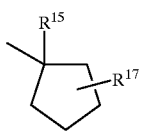

(11-2)
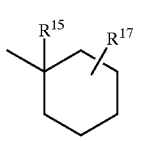

(11-3)
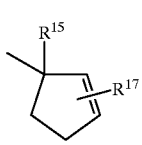

(11-4)
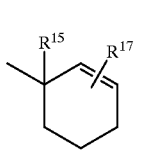

(11-5)
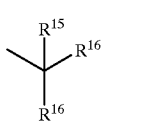

(11-6)
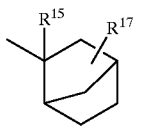

(11-7)
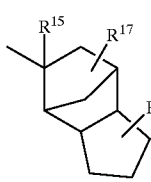

(11-8)
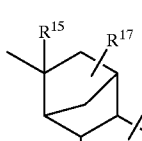

(11-9)
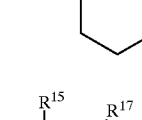

(11-10)
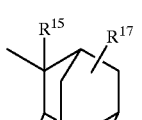

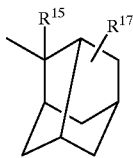
(11-11)

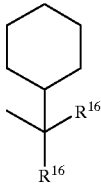
(11-12)

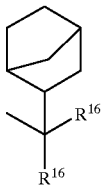
(11-13)

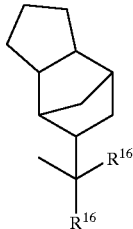
(11-14)

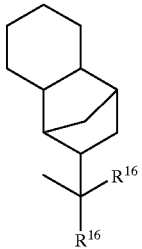
(11-15)

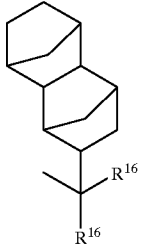
(11-16)

wherein $R^{15}$ and $R^{16}$ are each independently straight, branched or cyclic alkyl groups of 1 to 6 carbon atoms, $R^{17}$ is hydrogen or a monovalent hydrocarbon group of 1 to 6 carbon atoms which optionally comprises a hetero atom or a monovalent hydrocarbon group of 1 to 6 carbon atoms, and $R^{18}$ is hydrogen or an alkyl, hydroxyalkyl, alkoxyalkyl, alkoxy or alkoxyalkyl group of 1 to 20 carbon atoms.

8. A polymer of claim 1, wherein the acid labile group is selected from the group consisting of ethoxyethyl, butoxyethyl and ethoxypropyl.

9. The polymer of claim 1, wherein said polymer has a weight average molecular weight of about 1,000 to 1,000,000.

10. The polymer of claim 1, comprising 10 to 80 mol% of recurring units of formula (1).

11. The polymer of claim 1, wherein said polymer has a weight average molecular weight of about 2,000 to 100,000.

12. The polymer of claim 1, comprising 20 to 60 mol% of recurring units of formula (1).

13. A chemical amplification positive resist composition comprising
   (A) a polymer comprising recurring units of the formula (1) or a polymer comprising recurring units of the formula (1) and recurring units having acid labile groups,
   (B) an organic solvent, and
   (C) a photoacid generator.

14. The resist composition of claim 13 further comprising (D) a basic compound.

15. A process for forming a pattern, comprising the steps of:
   applying a resist composition of claim 14 onto a substrate to form a coating,
   heat treating the coating and exposing the coating to high energy radiation with a wavelength of up to 300 nm or electron beam through a photo mask,
   optionally heat treating the exposed coating, and developing the coating with a developer.

16. A resist composition according to claim 14, wherein the basic compound is an aliphatic amine.

17. The resist composition of claim 13 further comprising (E) a dissolution inhibitor.

18. A process for forming a pattern, comprising the steps of:
   applying a resist composition of claim 17 onto a substrate to form a coating,
   heat treating the coating and exposing the coating to high energy radiation with a wavelength of up to 300 nm or electron beam through a photo mask,
   optionally heat treating the exposed coating, and developing the coating with a developer.

19. A process for forming a pattern, comprising the steps of:
   applying the resist composition of claim 13 onto a substrate to form a coating,
   heat treating the coating and exposing the coating to high energy radiation with a wavelength of up to 300 nm or electron beam through a photo-mask,
   optionally heat treating the exposed coating, and developing the coating with a developer.

20. A chemical amplification positive resist composition according to claim 13, wherein the photoacid generator is selected from the group consisting of an onium salt of formula (12), a diazomethane derivative of formula (13), a glyoxime derivative of formula (14), a β-ketosulfone derivative, a disulfone derivative, a nitrobenzylsulfonate derivative, a sulfonic acid ester derivative, and an imidoyl sulfonate derivative,

$(R^{30})_b M^+ K^-$ (12)

wherein $R^{30}$ is straight, branched or cyclic alkyl group of 1 to 12 carbon atoms, an aryl group of 6 to 12 carbon atoms, or an aralkyl group of 7 to 12 carbon atoms, $M^+$ is iodonium or sulfonium, $K^-$ is a non-nucleophilic counter-ion, b is 2 or 3, (13)

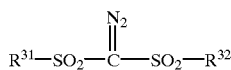

wherein $R^{31}$ and $R^{32}$ are each independently a straight, branched or cyclic alkyl or halogenated alkyl group of 1 to 12 carbon atoms, an aryl or halogenated aryl group of 6 to 12 carbon atoms, or an aralkyl group of 7 to 12 carbon atoms, (14)

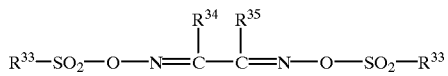

wherein $R^{33}$, $R^{34}$, and $R^{35}$ are each independently a straight, branched or cyclic alkyl or halogenated alkyl group of 1 to 12 carbon atoms, an aryl or halogenated aryl group of 6 to 12 carbon atoms, or an aralkyl group of 7 to 12 carbon atoms, $R^{34}$ and $R^{35}$ together optionally form a cyclic structure with the proviso that if they form a cyclic structure, each is a straight or branched alkylene group of 1 to 6 carbon atoms.

21. A chemical amplification positive resist composition according to claim 13, wherein the photoacid generator is selected from the group consisting of triphenylsulfonium trifluoromethanesulfonate, (p-tert-butoxyphenyl) diphenylsulfonium trifluoromethane-sulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, tris(p-tert-butoxyphenyl) sulfonium p-toluenesulfonate, bis(benzenesulfonyl)-diazomethane, bis(p-toluenesulfonyl) diazomethane, bis(cyclohexylsulfonyl) diazomethane, bis(n-butylsulfonyl)-diazomethane, bis(isobutylsulfonyl) diazomethane, bis(sec-butylsulfonyl)diazomethane, bis(n-propylsulfonyl)-diazomethane, bis(isopropylsulfonyl) diazomethane, bis(tert-butylsulfonyl)diazomethane, bis-o-(p-toluenesulfonyl)-α-dimethyl-glyoxime, bis-o-(n-butanesulfonyl)-α-dimethylglyoxime, and mixtures thereof.

* * * * *